(12) United States Patent
Lin

(10) Patent No.: US 12,086,329 B1
(45) Date of Patent: Sep. 10, 2024

(54) LIGHT EMITTING KEYBOARD

(71) Applicant: SUNREX TECHNOLOGY CORP., Taichung (TW)

(72) Inventor: Shih-Pin Lin, Taichung (TW)

(73) Assignee: Sunrex Technology Corp., Taichung (TW)

( * ) Notice: Subject to any disclaimer, the term of this patent is extended or adjusted under 35 U.S.C. 154(b) by 0 days.

(21) Appl. No.: 18/455,748

(22) Filed: Aug. 25, 2023

(30) Foreign Application Priority Data

Jun. 2, 2023 (TW) .................................. 112120713

(51) Int. Cl.
| G09G 5/00 | (2006.01) |
| F21V 33/00 | (2006.01) |
| G06F 3/02 | (2006.01) |
| H05K 1/02 | (2006.01) |
| H05K 1/11 | (2006.01) |
| F21Y 115/10 | (2016.01) |

(52) U.S. Cl.
CPC ........ *G06F 3/0202* (2013.01); *F21V 33/0052* (2013.01); *H05K 1/0274* (2013.01); *H05K 1/028* (2013.01); *H05K 1/0298* (2013.01); *H05K 1/115* (2013.01); *F21Y 2115/10* (2016.08); *H05K 2201/10106* (2013.01)

(58) Field of Classification Search
CPC .......... G06F 3/02; G06F 3/0202; G06F 3/019; H01H 2009/161; H01H 2219/014; H01H 2219/036; H01H 13/70; H05K 2201/10106

See application file for complete search history.

(56) References Cited

U.S. PATENT DOCUMENTS

| 6,057,517 | A * | 5/2000 | Meyer ............... H01H 13/702 200/1 TK |
| 7,952,043 | B2 * | 5/2011 | Lin .................... H01H 13/83 200/310 |
| 8,502,094 | B2 * | 8/2013 | Chen .................. H01H 13/83 200/5 A |
| 8,513,549 | B2 * | 8/2013 | Chen .................. G06F 3/0202 200/5 A |
| 11,894,201 | B1 * | 2/2024 | Lin ................... H01H 13/705 |
| 2009/0283393 | A1 * | 11/2009 | Chen .................. G06F 3/0202 200/314 |
| 2010/0108481 | A1 * | 5/2010 | Chiang ............... H01H 13/83 200/310 |

(Continued)

*Primary Examiner* — Joe H Cheng
(74) *Attorney, Agent, or Firm* — Burris Law, PLLC

(57) ABSTRACT

A light emitting keyboard includes a support plate having first and second plate portions, a membrane circuit board, a flexible circuit board electrically connected to the membrane circuit board, a backlight module disposed under the first plate portion, and a plurality of key modules disposed on top of the membrane circuit board. The membrane circuit board includes a lower circuit membrane disposed on top of the first plate portion, a partition plate having first and second partition portions, and an upper circuit membrane having first and second upper circuit sheet portions respectively disposed on top of the first and second partition portions. The flexible circuit board includes a lower circuit membrane disposed between the second plate portion and the second partition portion, and a plurality of light-emitting elements disposed on the lower circuit membrane of the flexible circuit board.

5 Claims, 12 Drawing Sheets

(56) References Cited

U.S. PATENT DOCUMENTS

| | | | |
|---|---|---|---|
| 2011/0162944 A1* | 7/2011 | Liu | G06F 3/0202 200/314 |
| 2012/0048702 A1* | 3/2012 | Liu | H01H 3/125 200/344 |
| 2012/0092259 A1* | 4/2012 | Liu | G06F 3/0412 345/173 |
| 2013/0118878 A1* | 5/2013 | Purcocks | H01H 9/04 29/622 |
| 2014/0168935 A1* | 6/2014 | Chen | H01H 3/125 362/23.03 |
| 2015/0014135 A1* | 1/2015 | Ho | H01H 3/125 200/5 A |
| 2018/0053610 A1* | 2/2018 | Liu | H01H 13/83 |
| 2019/0138111 A1* | 5/2019 | Lin | H01H 13/83 |
| 2022/0293356 A1* | 9/2022 | Wu | G02B 6/0021 |

* cited by examiner

LIGHT EMITTING KEYBOARD

CROSS-REFERENCE TO RELATED APPLICATION

This application claims priority to Taiwanese Invention patent application Ser. No. 11/212,0713, filed on Jun. 2, 2023.

FIELD

The present disclosure relates to a keyboard, and more particularly to a light emitting keyboard.

BACKGROUND

An existing light emitting keyboard includes a keyboard assembly having a plurality of keycaps, and a backlight module. The backlight module includes a light guide plate disposed under the keyboard assembly, a plurality of light blocking sheets stacked and disposed on an upper surface of the light guide plate, a plurality of reflective sheets stacked and disposed on a lower surface of the light guide plate, and a light-emitting element disposed on a lateral side of the light guide plate. Light emitted from the light-emitting element enters the light guide plate, which guides the light to the keycaps of the keyboard assembly after being reflected by the light blocking sheets and the reflective sheets, so that the keycaps generate a light-emitting effect.

Although the backlight module having the light guide plate may reduce the manufacturing cost of the existing light emitting keyboard, the total thickness of the existing light emitting keyboard is thick which can make the appearance thereof looks heavy.

Another existing light emitting keyboard includes a keyboard assembly having a plurality of keycaps, and a flexible circuit board. The flexible circuit board includes an upper circuit membrane, a partition plate, a lower circuit membrane, and a plurality of light-emitting elements disposed on the lower circuit membrane. The light-emitting elements respectively correspond to the keycaps of the keyboard assembly, and are capable of emitting light, so that the keycaps can generate a light emitting effect. Because the flexible circuit board is made of a plurality of stacked sheet components, the total thickness of the light emitting keyboard using the flexible circuit board is thinner than that of the aforesaid light emitting keyboard using the backlight module. However, the manufacturing cost of the light emitting keyboard using the flexible circuit board is high.

Hence, the aforesaid two existing light emitting keyboards cannot satisfy the requirement of maintaining a lower manufacturing cost while pursuing lighter and thinner keyboard.

SUMMARY

Therefore, an object of the present disclosure is to provide a light emitting keyboard that can alleviate at least one of the drawbacks of the prior art.

Accordingly, the light emitting keyboard of this disclosure includes a support plate, a membrane circuit board, a flexible circuit board, a backlight module, and a plurality of key modules. The support plate includes a first plate portion, and a second plate portion connected to the first plate portion. The membrane circuit board is disposed on top of the support plate, and includes a lower circuit membrane, a partition plate, and an upper circuit membrane. The lower circuit membrane is disposed on top of the first plate portion. The partition plate has a first partition portion disposed on top of the lower circuit membrane, and a second partition portion connected to the first partition portion and disposed on top of the second plate portion. The upper circuit membrane has a first upper circuit sheet portion disposed on top of the first partition portion, and a second upper circuit sheet portion connected to the first upper circuit sheet portion and disposed on top of the second partition portion.

The flexible circuit board is disposed on top of the second plate portion, is electrically connected to the membrane circuit board, and includes a lower circuit membrane disposed between the second plate portion and the second partition portion, and a plurality of light-emitting elements disposed on the lower circuit membrane of the flexible circuit board. The backlight module is disposed under the first plate portion. The key modules are disposed on top of the membrane circuit board. Each key module includes a keycap, and a connecting member pivoted between the keycap and the support plate.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
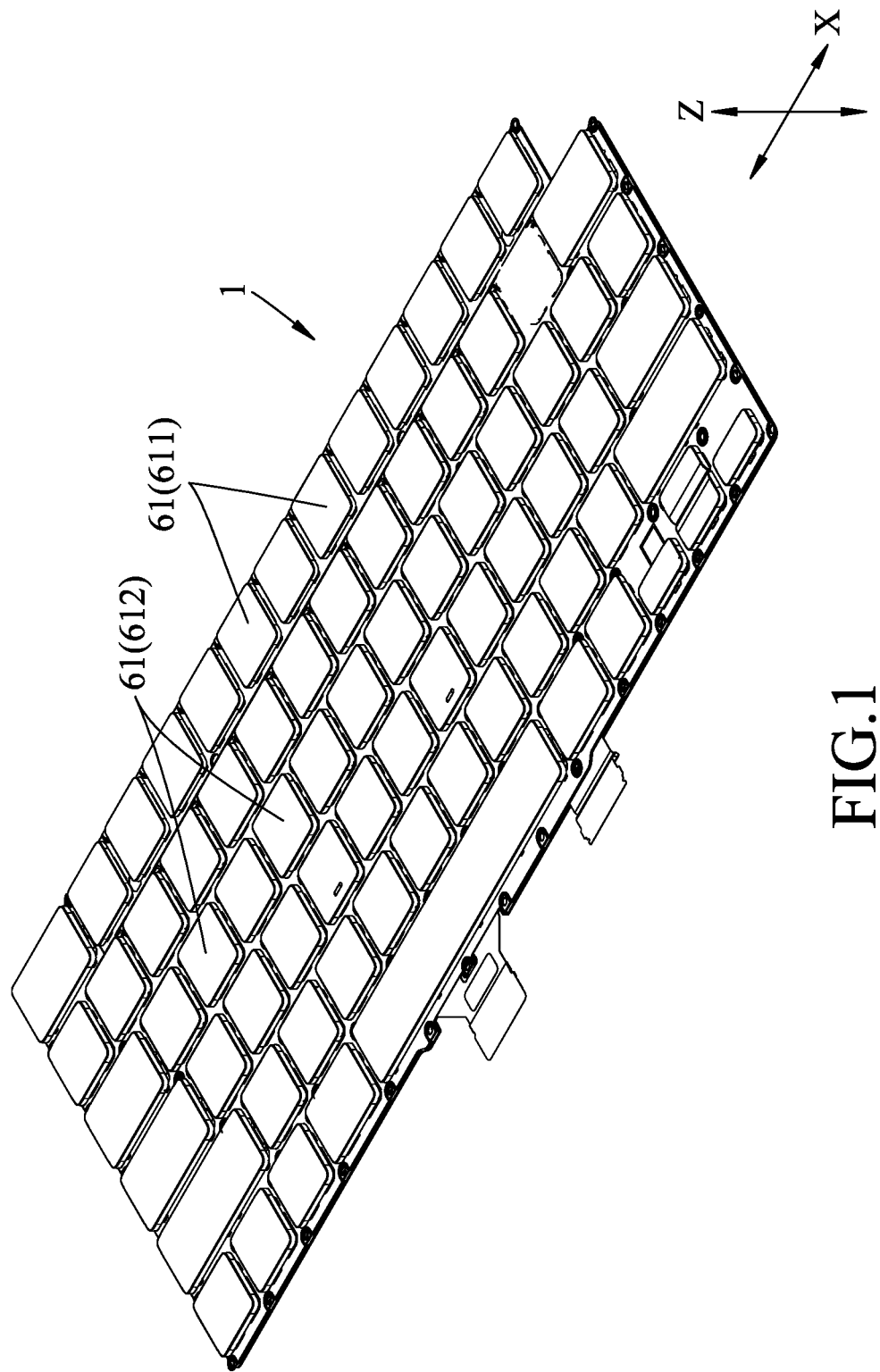
FIG. 1 is a perspective view of a light emitting keyboard according to an embodiment of the present disclosure.
Figure 2:
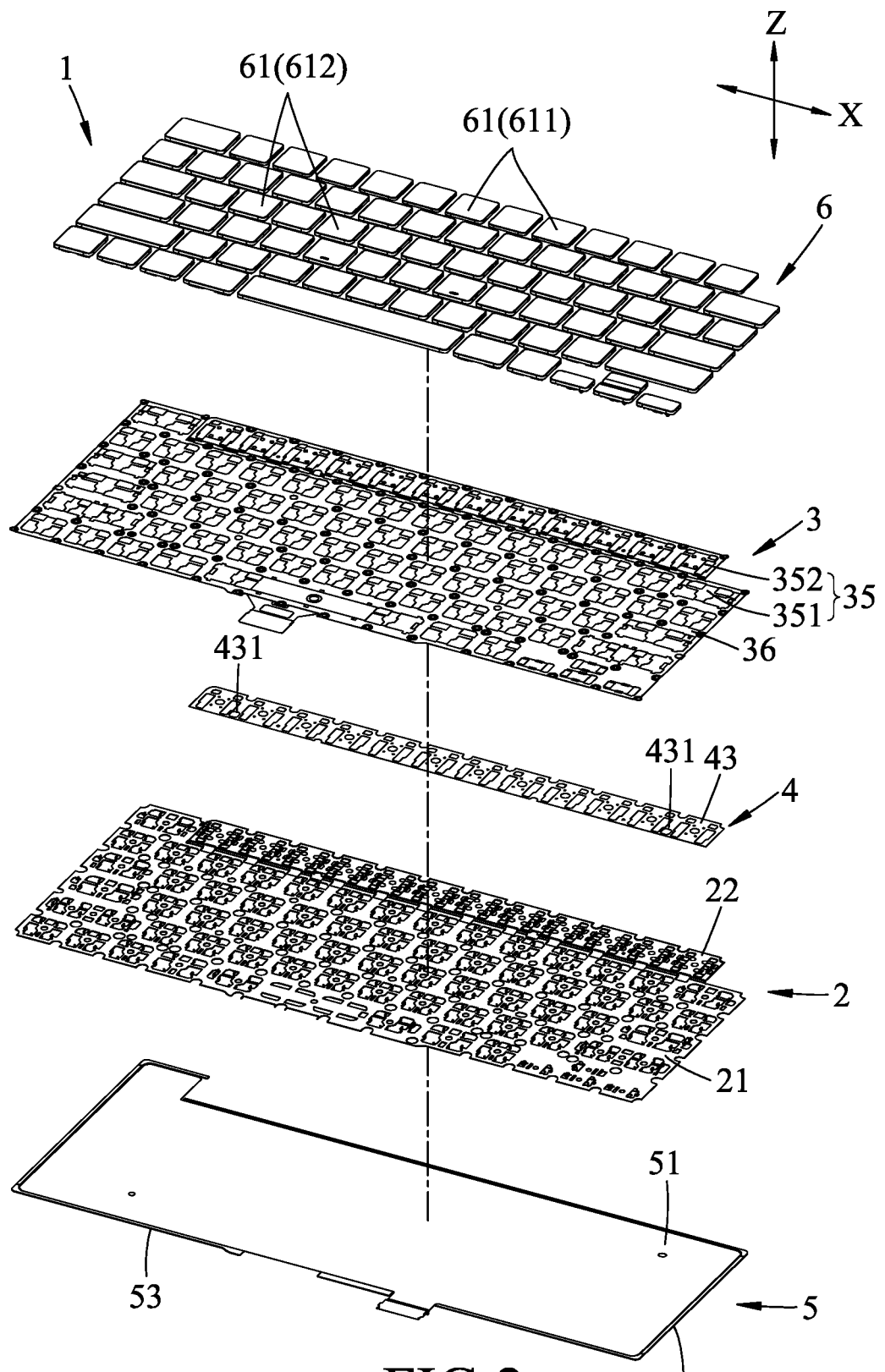
FIG. 2 is an exploded perspective view of the embodiment.
Figure 3:
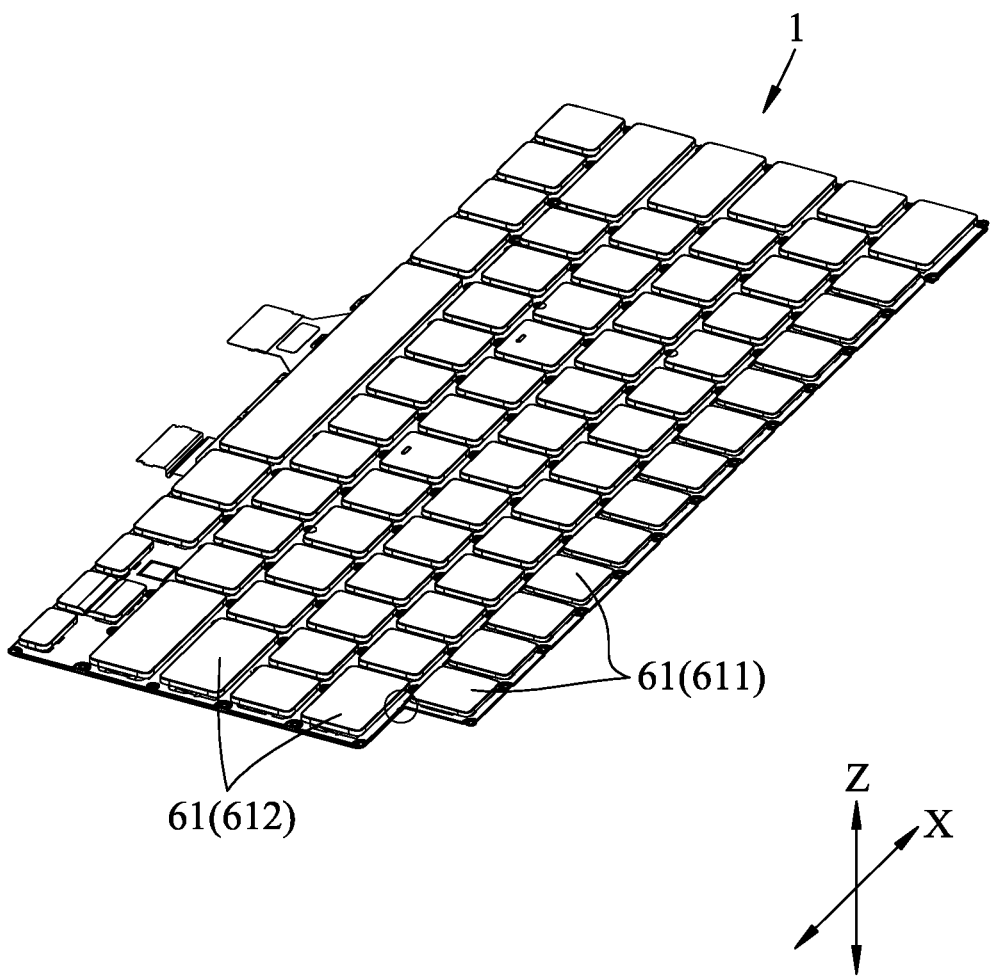
FIG. 3 is another perspective view of the embodiment.

Referring to FIGS. 1 to 3, a light emitting keyboard 1 according to an embodiment of the present disclosure is suitable for use in a notebook computer (not shown), and may also be applied to a keyboard device of a desktop computer. The light emitting keyboard 1 includes a support plate 2, a membrane circuit board 3, a flexible circuit board 4, a backlight module 5, and a key module 6.

The support plate 2 is made of metal, and includes a first plate portion 21, and a second plate portion 22 connected to the first plate portion 21.

Figure 4:
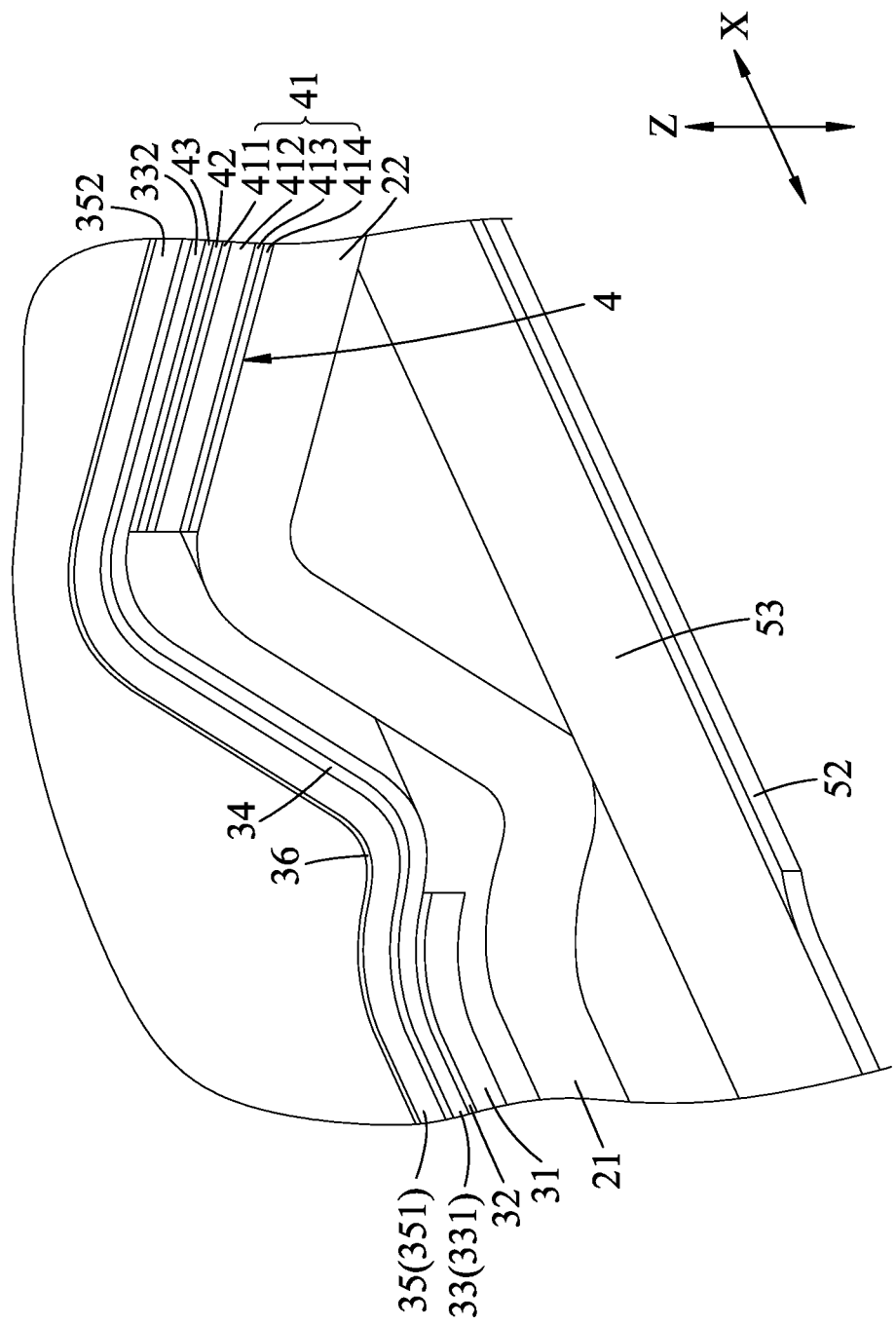
FIG. 4 is an enlarged fragmentary perspective view of an encircled portion of FIG. 3.
Figure 7:
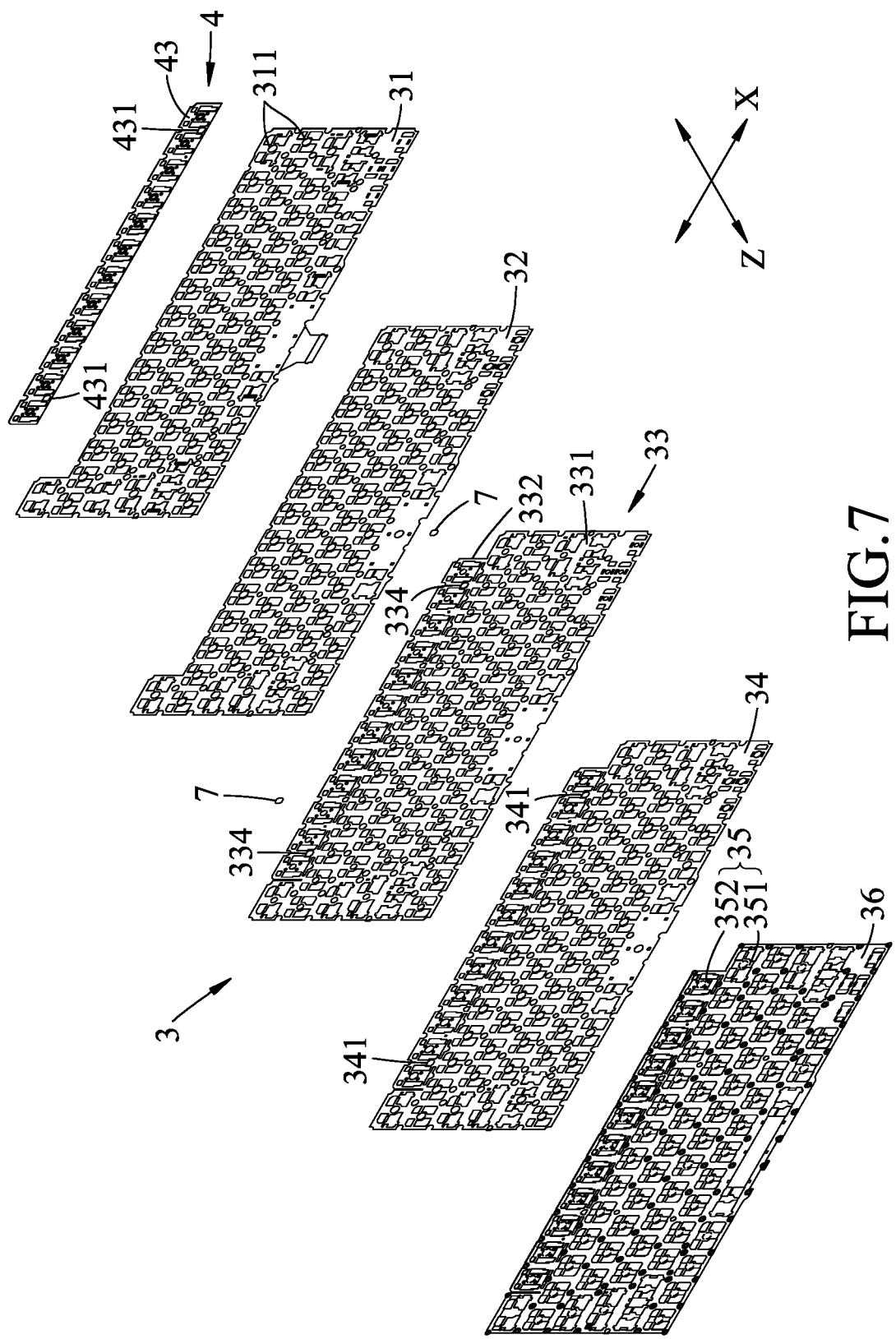
FIG. 7 is an exploded perspective view of the membrane circuit board and a flexible circuit board of the embodiment.

Referring to FIGS. 4 and 7, in combination with FIG. 2, the membrane circuit board 3 is disposed on top of the support plate 2 along an up-down direction (Z), and includes a lower circuit membrane 31 disposed on top of the first plate portion 21, a first transparent adhesive layer 32 disposed on top of the lower circuit membrane 31, a partition plate 33 disposed on top of the first transparent adhesive layer 32, a second transparent adhesive layer 34 disposed on top of the partition plate 33, an upper circuit membrane 35 disposed on top of the second transparent adhesive layer 34, and a black light blocking sheet 36 disposed on top of the upper circuit membrane 35. An upper surface of the lower circuit membrane 31 has a plurality of lower conductive members 311.

The partition plate 33 has a first partition portion 331 disposed on top of the first transparent adhesive layer 32, a second partition portion 332 connected to the first partition portion 331 and disposed on top of the second plate portion 22, and a plurality of through holes 333 (see FIG. 10) formed in the first and second partition portions 331, 332. In this embodiment, the second partition portion 332 has two upper mating holes 334 extending therethrough and spaced apart in a left-right direction (X) transverse to the up-down direction (Z). The through holes 333 formed in the first partition portion 331 respectively correspond to the lower conductive members 311.

The first transparent adhesive layer 32 is located between the lower circuit membrane 31 and the first partition portion 331.

Figure 10:
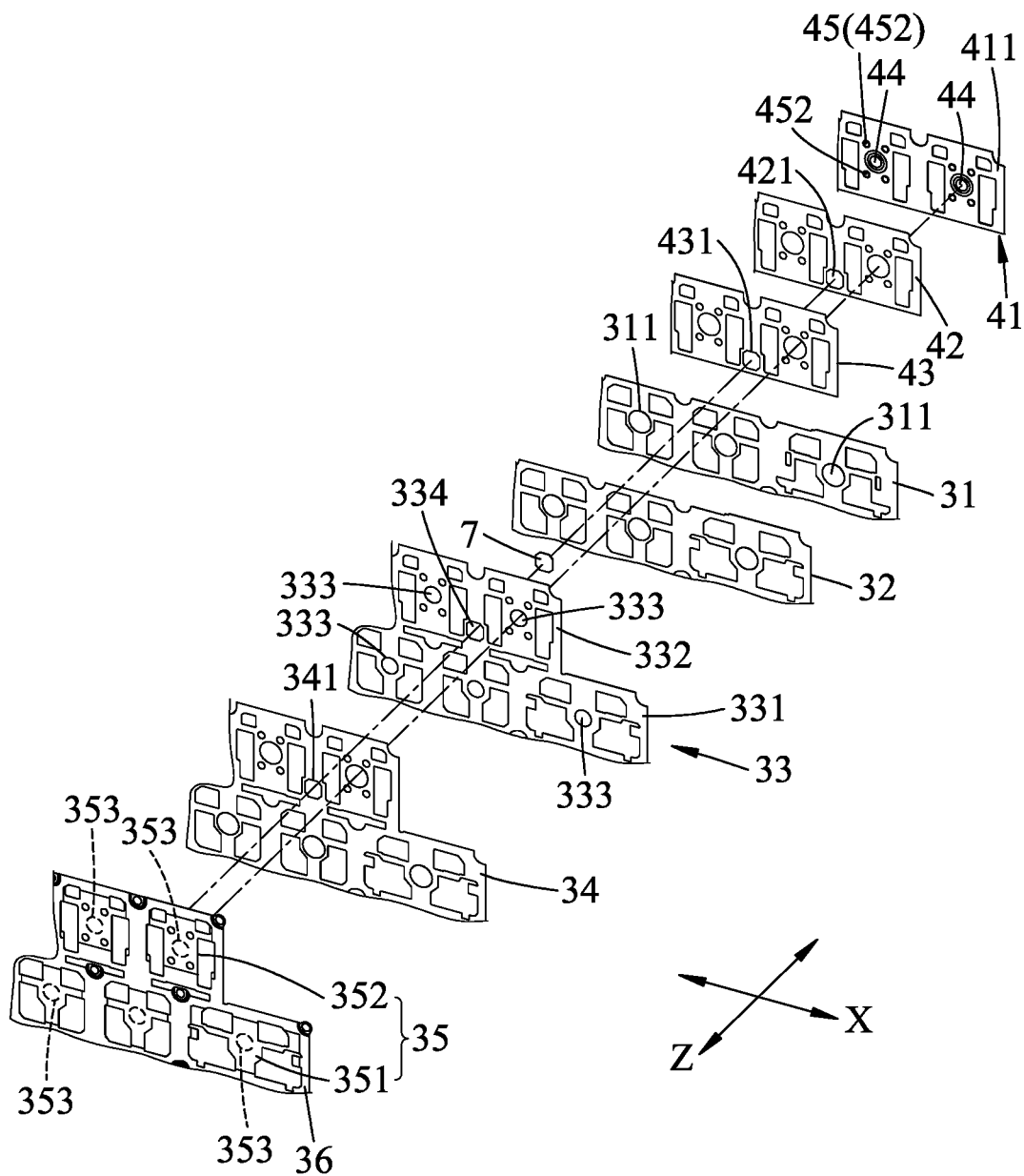
FIG. 10 is a partial exploded perspective view of the membrane circuit board and the flexible circuit board of the embodiment.

Referring to FIG. 10, in combination with FIGS. 4 and 7, the upper circuit membrane 35 has a first upper circuit sheet portion 351 disposed on top of the first partition portion 331, a second upper circuit sheet portion 352 connected to the first upper circuit sheet portion 351 and disposed on top of the second partition portion 332, and a plurality of upper conductive members 353 disposed on a lower surface of the first upper circuit sheet portion 351 and a lower surface of the second upper circuit sheet portion 352. The upper conductive members 353 disposed on the lower surface of the first upper circuit sheet portion 351 correspond to the through holes 333 formed in the first partition portion 331 and correspond to the lower conductive members 311. Thus, the upper conductive members 353 can contact and conduct with the lower conductive members 311 through the through holes 333.

Figure 11:
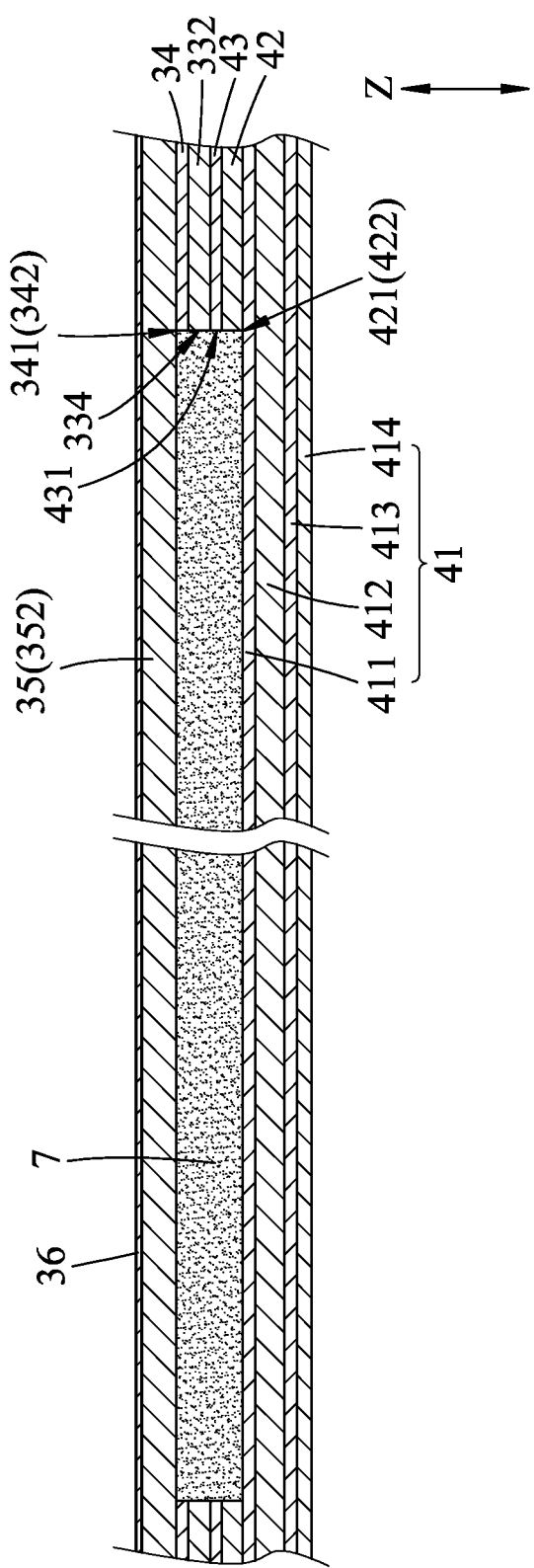
FIG. 11 is a sectional view taken along line XI-XI of FIG. 9.

Referring to FIG. 11, in combination with FIGS. 7 and 10, the second transparent adhesive layer 34 is disposed between the upper circuit membrane 35 and the partition plate 33. In particular, the second transparent adhesive layer 34 is disposed between the first partition portion 331 and the first upper circuit sheet portion 351, and is disposed between the second partition portion 332 and the second upper circuit sheet portion 352. In this embodiment, the second transparent adhesive layer 34 has two upper communication holes 341 spaced apart from each other in the left-right direction (X) and respectively communicating with the upper mating holes 334. Each upper communication hole 341 has an upper end 342 away from the respective upper mating hole 334 and adjacent to the lower surface of the second upper circuit sheet portion 352.

Figure 8:
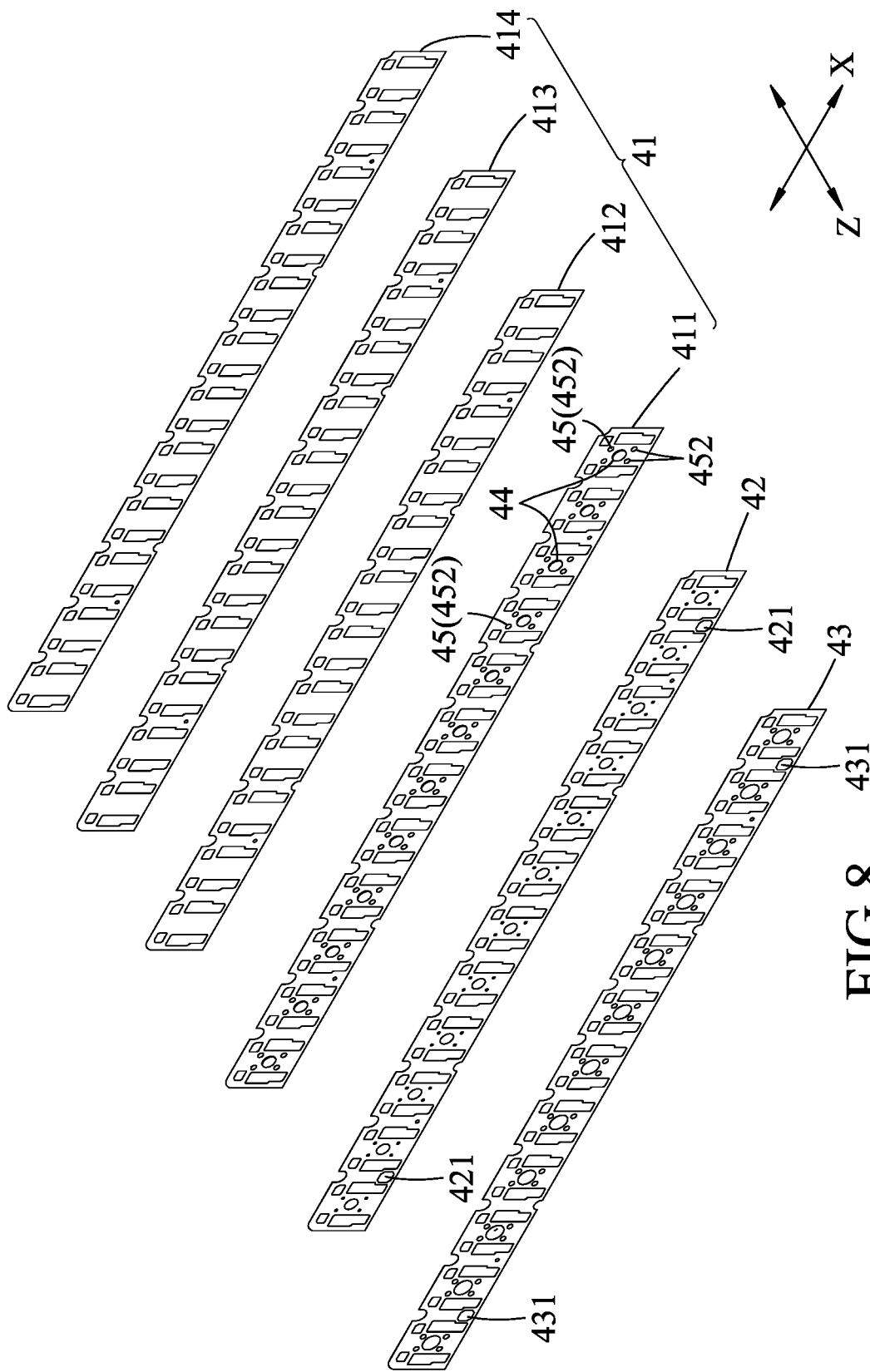
FIG. 8 is an exploded perspective view of the flexible circuit board of the embodiment.

Referring to FIG. 8, in combination with FIGS. 2 and 4, the flexible circuit board 4 is disposed on top of the second plate portion 22, and is electrically connected to the membrane circuit board 3. The flexible circuit board 4 includes a lower circuit membrane 41 disposed on top of the second plate portion 22 of the support plate 2, an upper cover film layer 42 disposed on top of the lower circuit membrane 41, a third transparent adhesive layer 43 disposed between the upper cover film layer 42 and the second partition portion 332, a plurality of lower conductive members 44 disposed on the lower circuit membrane 41, and a plurality of light-emitting units 45 disposed on the lower circuit membrane 41 and corresponding to the lower conductive members 44.

The lower circuit membrane 41 has an upper copper layer 411 disposed under the upper cover film layer 42, a base layer 412 disposed under the upper copper layer 411, a lower copper layer 413 disposed under the base layer 412, and a lower cover film layer 414 disposed under the lower copper layer 413. The lower cover film layer 414 is located between the lower copper layer 413 and the second plate portion 22.

The upper cover film layer 42 has two lower mating holes 421 spaced apart in the left-right direction (X).

Referring again to FIGS. 7, 8 and 11, in this embodiment, the third transparent adhesive layer 43 has two lower communication holes 431 spaced apart in the left-right direction (X). The lower communication holes 431 respectively communicate with the upper mating holes 334, and respectively communicate with the lower mating holes 421, so that the upper mating holes 334 respectively communicate with the lower mating holes 421. Each lower mating hole 421 has a lower end 422 away from the respective lower communication hole 431 and adjacent to the upper copper layer 411.

Referring back to FIG. 10, the lower conductive members 44 correspond to the upper conductive members 353 disposed on the lower surface of the second upper circuit sheet portion 352, and correspond to the through holes 333 formed in the second partition portion 332. Thus, the upper conductive members 353 can contact and conduct with the lower conductive members 44 through the through holes 333 formed in the second partition portion 332.

With reference to FIGS. 7, 10 and 11, in this embodiment, the light emitting keyboard 1 further includes two conductive adhesive layers 7 arranged in the left-right direction (X). Each conductive adhesive layer 7 is filled in a corresponding one of the upper communication holes 341, a corresponding one of the upper mating holes 334, a corresponding one of the lower communication holes 431, and a corresponding one of the lower mating holes 421. The conductive adhesive layers 7 of this embodiment are anisotropic conductive adhesives, but not limited thereto. With the upper end 342 of each upper communication hole 341 being away from the respective upper mating hole 334 and being adjacent to the lower surface of the second upper circuit sheet portion 352, and with the lower end 422 of each lower mating hole 421 being away from the respective lower communication hole 431 and being adjacent to the upper copper layer 411 of the lower circuit membrane 41, the conductive adhesive layers 7 can electrically connect with the second upper circuit sheet portion 352 and the lower circuit membrane 41 of the flexible circuit board 4. As such, the flexible circuit board 4 can receive the power supply and control signal of the membrane circuit board 3. Thus, when the upper conductive members 353 of the second upper circuit sheet portion 352 are in conduction with the lower conductive members 44 of the flexible circuit board 4, a control signal can be generated.

Figure 9:
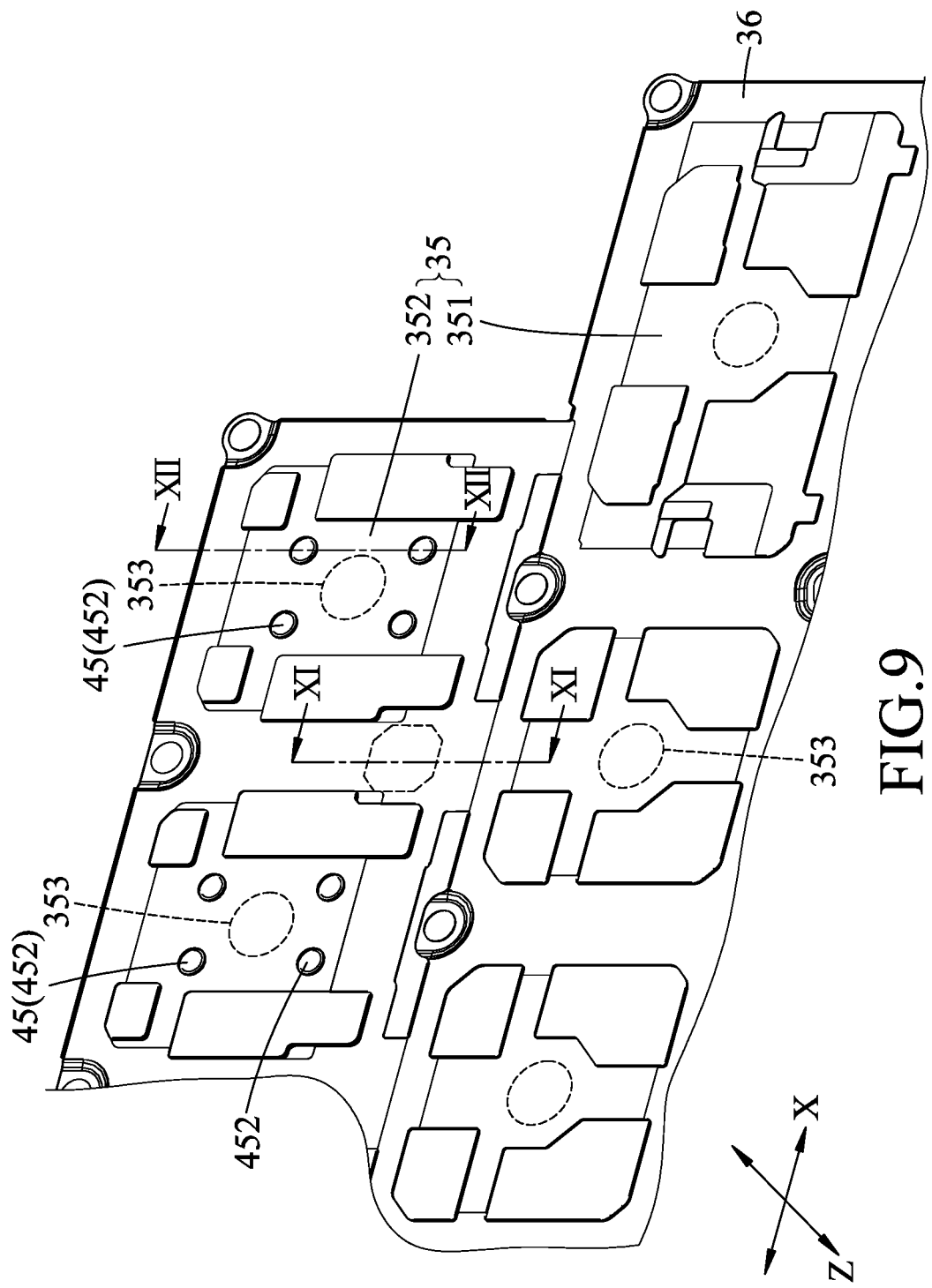
FIG. 9 is an enlarged fragmentary perspective view of FIG. 6.
Figure 12:
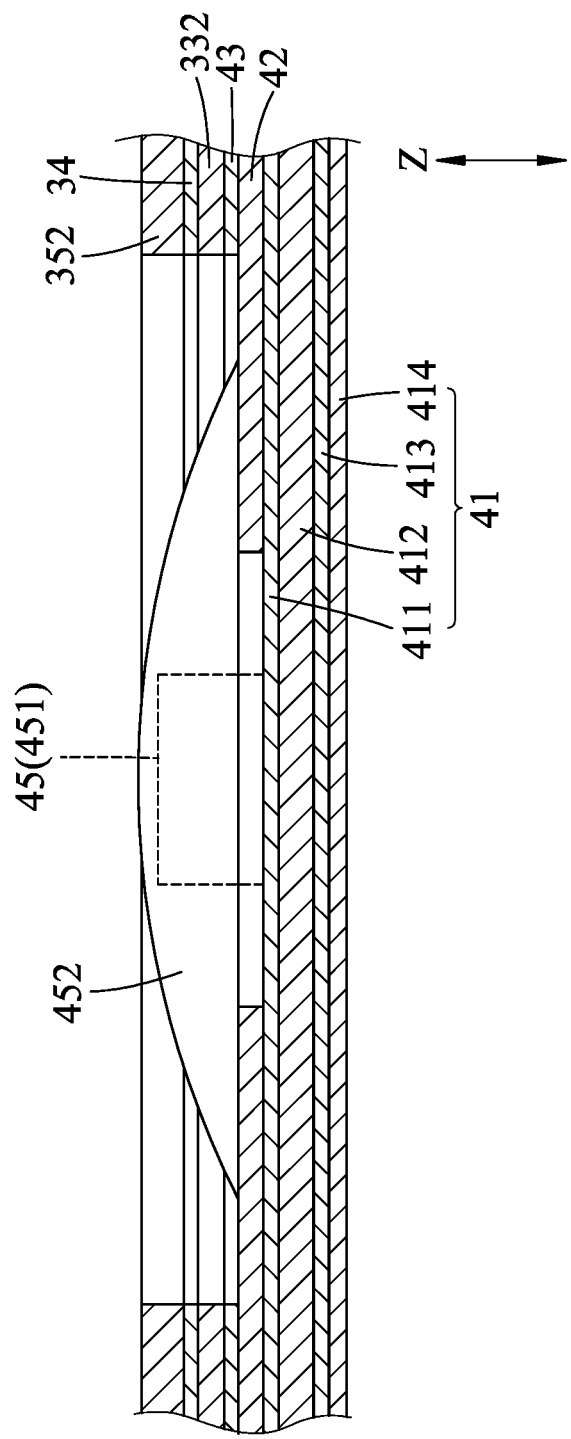
FIG. 12 is a sectional view taken along line XII-XII of FIG. 9.

Referring to FIG. 12, in combination with FIGS. 9 and 10, in this embodiment, each light-emitting unit 45 includes four light-emitting elements 451 (only one is shown in FIG. 12) disposed on the upper copper layer 411 and surrounding a corresponding lower conductive member 44, and four light expanding elements 452 respectively covering the light-emitting elements 451. Each light-emitting element 451 is a mini light emitting diode (LED), and is capable of emitting light upwardly toward the key module 6 (see FIG. 2). The light expanding elements 452 are used for uniformly diffusing the light emitted from the light-emitting elements 451. It is worth to mention herein that the light-emitting units 45 can be controlled separately, so that the light-emitting elements 451 of each light-emitting unit 45 can emit light of the same color as or different color from that of the light-emitting elements 451 of the other light-emitting units 45.

Figure 5:
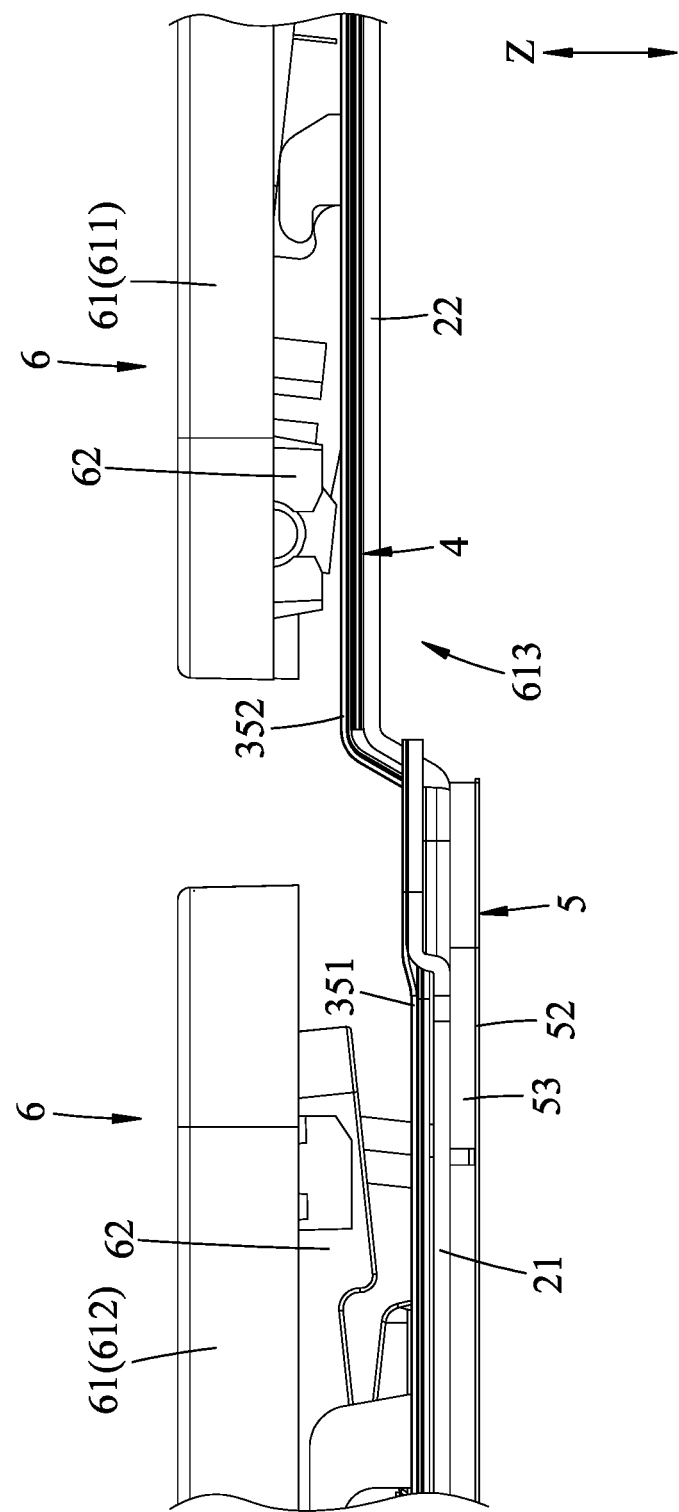
FIG. 5 is an enlarged fragmentary side view of FIG. 3.

Referring again to FIGS. 2, 4 and 5, the backlight module 5 includes a light guide plate 51 disposed under the first plate portion 21 of the support plate 2, a light reflecting layer (not shown) disposed under the light guide plate 51, a backlight circuit board 52 disposed under the light guide plate 51, a plurality of light sources (not shown) disposed on the backlight circuit board 52 and located on one side of the light guide plate 51, and a light blocking strip 53 surrounding a periphery of the light guide plate 51. The backlight circuit board 52 can control the light sources to emit light. The light guide plate 51 can uniformly guide the light emitted from the light sources to the upper and lower surfaces thereof. The light on the upper surface of the light guide plate 51 is projected upwardly to the key module 6, and the light on the lower surface of the light guide plate 51 is reflected upwardly to the key module 6 through the light reflecting layer so as to increase the luminous efficiency of the backlight module 5. The light blocking strip 53 is used to prevent light from leaking from the side of the light guide plate 51 which can reduce the luminous efficiency of the backlight module 5.

Referring back to FIGS. 1, 2 and 5, each key module 6 is disposed on top of the membrane circuit board 3, includes a keycap 61, a connecting member 62 pivoted between the keycap 61 and the support plate 2, and a biasing member (not shown) abutting between the upper circuit membrane 35 and the keycap 61. The biasing members of the key modules 6 respectively correspond to the upper conductive members 353 (see FIG. 6). In this embodiment, the connecting member 62 is a scissor mechanism, and the biasing member is a rubber dome.

Figure 6:
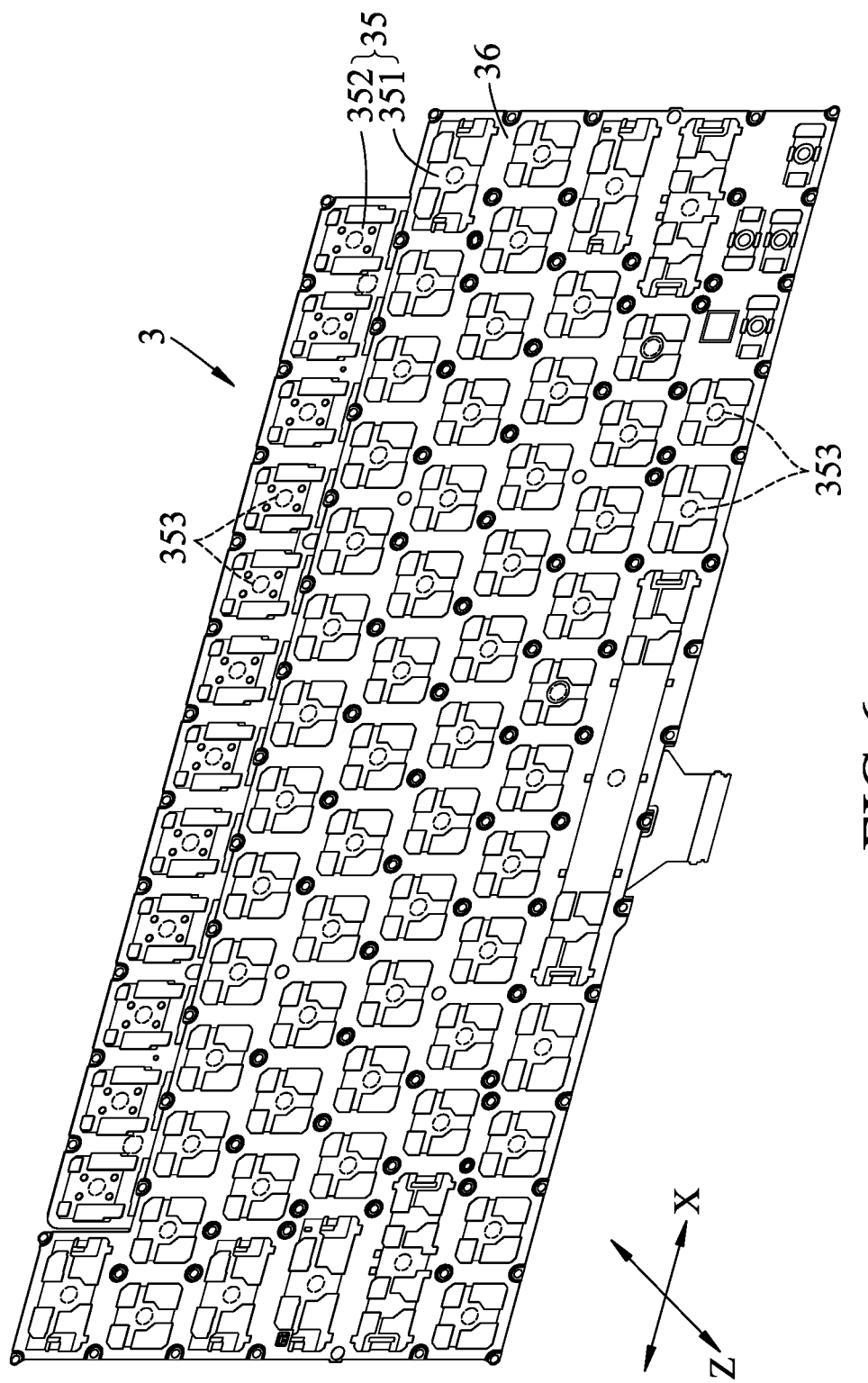
FIG. 6 is a perspective view of a membrane circuit board of the embodiment.

With reference to FIGS. 2, 6 and 10, when a user presses the keycaps 61, the keycaps 61 move close to the membrane circuit board 3 and compress the biasing members. At this time, the biasing members push downwardly the respective upper conductive members 353, so that the upper conductive members 353 conduct with the corresponding lower conductive members 311 and the corresponding lower conductive members 44 to generate a control signal.

With reference to FIGS. 2, 5, 9 and 12, in this embodiment, the keycaps 61 pivotally connected to the second plate portion 22 through the connecting members 62 are respectively functional keys 611 (e.g., F1-F12) that provide various shortcut functions in the light emitting keyboard 1, and the functional keys 611 respectively correspond to the light-emitting units 45. Through the light-emitting elements 451 of each light-emitting unit 45 which can emit light of the same as or different color from the light-emitting elements 451 of the other light-emitting units 45, the functional keys 611 can have different backlight color applications.

Referring again to FIGS. 2 and 5, in this embodiment, the keycaps 61 pivotally connected to the first plate portion 21 through the connecting members 62 are respectively general buttons 612 for inputting English alphabets, numbers or symbols in the light emitting keyboard 1. The general buttons 612 correspond in position to the backlight module 5, and the light guide plate 51 and the light reflecting layer of the backlight module 5 project light emitted from the light sources upwardly to the general buttons 612.

With the flexible circuit board 4 disposed between the second plate portion 22 and the second upper circuit sheet portion 352, and with the backlight module 5 disposed under the first plate portion 21, the total thickness of the light emitting keyboard 1 at a location corresponding to the functional keys 611 is thinner than the total thickness of the light emitting keyboard 1 at a location corresponding to the general buttons 612. As such, a space 613 (FIG. 5) is available in the light emitting keyboard 1 at the location corresponding to the functional keys 611 for use by other hardware devices of the notebook computer. Furthermore, since the general buttons 612 occupy a larger proportion of the area of the light emitting keyboard 1 than the functional keys 611, use of the backlight module 5 at the location corresponding to the general buttons 612 can greatly reduce the manufacturing cost of the light emitting keyboard 1.

It should be particularly noted that those skilled in the art may adjust the areas where the flexible circuit board 4 and the backlight module 5 are used in the light emitting keyboard 1 according to the actual use requirements, for example, the flexible circuit board 4 may be used at the location corresponding to the general buttons 612, and the backlight module 5 may be used at the location corresponding to the functional keys 611, so that the location areas of the flexible circuit board 4 and the backlight module 5 are not limited to what is disclosed in this embodiment.

In summary, by virtue of disposing the backlight module 5 under the first plate portion 21, and by providing the flexible circuit board 4 between the second plate portion 22 and the second upper circuit sheet portion 352, the light emitting keyboard 1 has a thinner thickness at an area corresponding to the second plate portion 22, and the area corresponding to the second plate portion 22 compared to the area corresponding to the first plate portion 21 is thinner, and thus has the space 613 for use by other hardware devices of the notebook computer. Furthermore, since the area corresponding to the first plate portion 21 uses the backlight module 5, the manufacturing cost of the light emitting keyboard 1 can be relatively reduced. Therefore, the object of this disclosure can indeed be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:
1. A light emitting keyboard, comprising:
a support plate including a first plate portion, and a second plate portion connected to said first plate portion;
a membrane circuit board disposed on top of said support plate and including a lower circuit membrane, a partition plate, and an upper circuit membrane, said lower circuit membrane being disposed on top of said first plate portion, said partition plate having a first partition portion disposed on top of said lower circuit membrane, and a second partition portion connected to said first partition portion and disposed on top of said second plate portion, said upper circuit membrane having a first upper circuit sheet portion disposed on top of said first partition portion, and a second upper circuit sheet portion connected to said first upper circuit sheet portion and disposed on top of said second partition portion;
a flexible circuit board disposed on top of said second plate portion and electrically connected to said membrane circuit board, said flexible circuit board including a lower circuit membrane disposed between said second plate portion and said second partition portion, and a plurality of light-emitting elements disposed on said lower circuit membrane of said flexible circuit board;

a backlight module disposed under said first plate portion; and a plurality of key modules disposed on top of said membrane circuit board, each of said key modules including a keycap, and a connecting member pivoted between said keycap and said support plate.

2. The light emitting keyboard as claimed in claim 1, wherein said second partition portion has a plurality of upper mating holes extending therethrough, said flexible circuit board further including an upper cover film layer disposed between said second partition portion and said lower circuit membrane of said flexible circuit board, said upper cover film layer having a plurality of lower mating holes respectively communicating with said upper mating holes, each of said lower matching holes having a lower end away from a respective one of said upper mating holes and adjacent to said lower circuit membrane of said flexible circuit board, said light emitting keyboard further comprising a plurality of conductive adhesive layers filled in said upper mating holes and said lower mating holes and electrically connected to said second upper circuit sheet portion and said lower circuit membrane of said flexible circuit board.

3. The light emitting keyboard as claimed in claim 2, wherein said membrane circuit board further includes a first transparent adhesive layer disposed between said lower circuit membrane of said membrane circuit board and said partition plate, and a second transparent adhesive layer disposed between said partition plate and said upper circuit membrane, said second transparent adhesive layer having a plurality of upper communication holes respectively communicating with said upper mating holes, each of said upper communication holes having an upper end away from a respective one of said upper mating holes and adjacent to said second upper circuit sheet portion, said flexible circuit board further including a third transparent adhesive layer disposed between said second partition portion and said upper cover film layer, said third transparent adhesive layer having a plurality of lower communication holes respectively communicating with said upper mating holes and said lower mating holes, each of said conductive adhesive layers being filled in a corresponding one of said upper communication holes, a corresponding one of said upper mating holes, a corresponding one of said lower communication holes and a corresponding one of said lower mating holes so as to electrically connect said second upper circuit sheet portion with said lower circuit membrane of said flexible circuit board.

4. The light emitting keyboard as claimed in claim 2, wherein said conductive adhesive layers are anisotropic conductive adhesives.

5. The light emitting keyboard as claimed in claim 1, wherein said upper circuit membrane further has a plurality of upper conductive members disposed on said first upper circuit sheet portion and said second upper circuit sheet portion, said partition plate further having a plurality of through holes formed in said first partition portion and said second partition portion and corresponding to said upper conductive members, said lower circuit membrane of said membrane circuit board having a plurality of lower conductive members corresponding to said through holes formed in said first partition portion and corresponding to said upper conductive members disposed on said first upper circuit sheet portion, said flexible circuit board further including a plurality of lower conductive members that are disposed on said lower circuit membrane of said flexible circuit board, that correspond to said through holes formed in said second partition portion, and that correspond to said upper conductive members disposed on said second upper circuit sheet portion.

* * * * *